United States Patent [19]
Hsu

[11] Patent Number: 5,538,909
[45] Date of Patent: Jul. 23, 1996

[54] METHOD OF MAKING A SHALLOW TRENCH LARGE-ANGLE-TILT IMPLANTED DRAIN DEVICE

[75] Inventor: Chen-Chung Hsu, Taichung, Taiwan

[73] Assignee: United Microelectronics Corporation, Hsinchu, Taiwan

[21] Appl. No.: 374,434

[22] Filed: Jan. 19, 1995

[51] Int. Cl.$^6$ .................................................. H01L 21/265
[52] U.S. Cl. ................................................. 437/35; 437/44
[58] Field of Search ........................... 437/35, 44, 41 RL

[56] References Cited

U.S. PATENT DOCUMENTS

| | | | |
|---|---|---|---|
| 5,262,337 | 11/1993 | Kim | 437/35 |
| 5,382,534 | 1/1995 | Sheu et al. | 437/35 |
| 5,403,763 | 4/1995 | Yamazaki | 437/35 |

FOREIGN PATENT DOCUMENTS

| | | | |
|---|---|---|---|
| 02-15662 | 6/1990 | Japan | 437/35 |

*Primary Examiner*—Tom Thomas
*Assistant Examiner*—Lynne A. Gurley
*Attorney, Agent, or Firm*—Cushman Darby & Cushman

[57] ABSTRACT

The present invention provides a novel MOS transistor structure and method of fabrication. To make this device, a gate electrode is formed on a silicon substrate first and a pair of shallow trenches with a depth of between 200Å to 500Å are formed apart on portions of the silicon substrate adjacent to the gate electrode. Next, lightly doped source/drain regions that extends to areas under the gate electrode are formed on the silicon substrate by using the large-angle-tilt implanted drain technique. The highest electric field of the lightly doped source/drain regions can be shifted into areas under the gate oxide layer at a depth of between 200Å to 500Å. Therefore, the probability of hot electron injection into the gate oxide layer is reduced and the device reliability is improved. In addition, the gate to drain capacitance is reduced, leading to an increase in device speed.

15 Claims, 6 Drawing Sheets

5,538,909

METHOD OF MAKING A SHALLOW TRENCH LARGE-ANGLE-TILT IMPLANTED DRAIN DEVICE

BACKGROUND OF THE INVENTION

1. Field of the Invention

The present invention relates to the field of metal-oxide-semiconductor field-effect-transistor (MOSFET) devices, and more particularly to a shallow trench large-angle-tilt implanted drain (LATID) device and method of fabrication.

2. Description of the Prior Art

With the continual improvement of semiconductor integrated circuit fabrication techniques, the number of devices which can be packed onto a semiconductor chip has increased greatly, while the size of the individual devices has decreased markedly. In submicron sized transistors, hot electron injection into the gate of such transistors poses a serious reliability problem. Modified structures and fabrication processes have been proposed to overcome this problem in the attempt to design a high speed very large scale integration (VLSI) manufacturable submicron MOS transistor which exhibits resistance to hot electron degradation.

One such device is the lightly doped drain (LDD) transistor. Please refer to FIGS. 1A and 1B, for the purpose of better understanding, which illustrate in cross-sectional views the process steps for fabricating a prior art LDD transistor. As can be seen in FIG. 1A, a gate oxide layer 11 and a polysilicon gate layer 12 are formed on a P-type silicon substrate 10 in sequence, thereby forming a gate electrode. Then, N-type impurities, such as phosphorous ions, are implanted into the silicon substrate 10 by using the gate electrode as a mask, so as to form a pair of lightly doped $N^-$ source/drain regions 13. Please now refer to FIG. 1B, a pair of sidewall spacers 14 are formed on the sidewalls of the gate electrode. Different N-type impurity, such as arsenic ions, is implanted into the silicon substrate 10 by using the gate electrode and the sidewall spacers 14 as a mask, so as to form a pair of heavily doped $N^+$ source/drain regions 15. Thus, completes the fabrication of a prior art LDD MOSFET. Such LDD structure increases the transistor's resistance to hot electron degradation by reducing the peak electric field of the source/drain regions. However, since the $N^-$ source/drain regions 13 are not located under the gate electrode, a trapped charge is formed during hot electron injecting into the sidewall spacers 14, which causes a threshold voltage shift and results in unsatisfactory device characteristics.

A large-angle-tilt implanted drain (LATID) transistor was proposed to decrease hot electron degradation as well as prevent hot electrons from being trapped into the sidewall spacers. Please refer to FIGS. 2A and 2B, for the purpose of better understanding, which illustrate in cross-sectional view the process steps of fabricating a LATID transistor. As can be seen in FIG. 2A, a gate electrode comprising a gate oxide layer 21 and a polysilicon gate layer 22 is formed on a P-type silicon substrate 20. A thin oxide layer 23 is then formed on the exposed surface of the silicon substrate 20 and the gate electrode. N-type impurities, such as phosphorous ions, are implanted with an angle of about 45 degrees into the silicon substrate 20 to form a pair of lightly doped $N^-$ source/drain regions 24. Please note that the $N^-$ source/drain regions 24 are extended to areas under the gate electrode. Next, please refer to FIG. 2B, a pair of sidewall spacers 25 are formed on the sidewalls of the gate electrode. Different N-type impurities, such as arsenic ions, are implanted with an angle of about 7 degrees into the silicon substrate 20 by using the gate electrode and the sidewall spacers 25 as a mask, so as to form a pair of heavily doped $N^+$ source/drain regions 26. Thus, completes the fabrication of the LATID transistor. This transistor structure not only decreases hot electron injection into the sidewall spacers, but also eliminates the threshold voltage shift due to the $N^-$ lightly doped source/drain regions 24 that are located under the gate electrode. It is obvious that the LATID transistor displays better device characteristics than the prior art LDD transistor does. However, since the $N^-$ lightly doped source/drain regions 24 are located under the gate electrode, a parasitic capacitor is formed between the polysilicon gate layer 22 and the $N^-$ lightly doped source/drain regions 24. Therefore the device operation speed is reduced. In addition, hot electrons which cause the device degradation are still easily injected into the gate oxide layer 21 since the electric field near the gate oxide layer 21 is still relatively intense.

It is therefore an object of the present invention to provide a MOS transistor structure which is made to increase the resistance to hot electron degradation and improve the device speed by decreasing the gate to drain capacitance.

It is another object of the present invention to provide a method of fabricating a MOS transistor with a high resistance to hot electron degradation and a low gate-to-drain capacitance.

SUMMARY OF THE INVENTION

In accordance with the objects of the present invention, a novel MOS transistor structure and method of fabrication are provided. To make this device, a gate electrode is formed on a silicon substrate first and a pair of shallow trenches with a depth of between 200Å to 500Å are formed apart on portions of the silicon substrate adjacent to the gate electrode. Next, lightly doped source/drain regions that extend to areas under the gate electrode are formed on the silicon substrate by using the large-angle-tilt implanted drain technique. The highest electric field of the lightly doped source/drain regions can be shifted into areas under the gate oxide layer at a depth of between 200Å to 500Å. Therefore, the probability of hot electron injection into the gate oxide layer is reduced and the device reliability is improved. In addition, the gate to drain capacitance is also reduced, leading to an increase in device speed.

BRIEF DESCRIPTION OF THE DRAWINGS

The present invention will be more fully understood from the following detailed description of the preferred embodiments with reference to the accompanying drawings, wherein.

DETAILED DESCRIPTION OF THE PREFERRED EMBODIMENTS

Embodiment 1

Please now refer to FIGS. 3A to 3F which show the process steps of fabricating a MOS transistor in accordance with the first embodiment of the present invention.

Figure 1A:
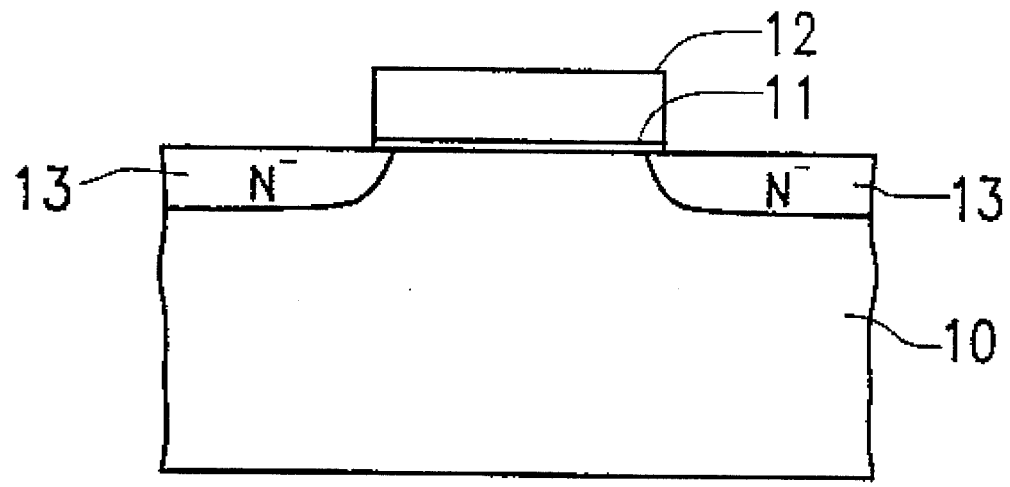
FIGS. 1A to 1B illustrate, in cross-sectional view, the process steps of fabricating a prior art LDD transistor.
Figure 1B:
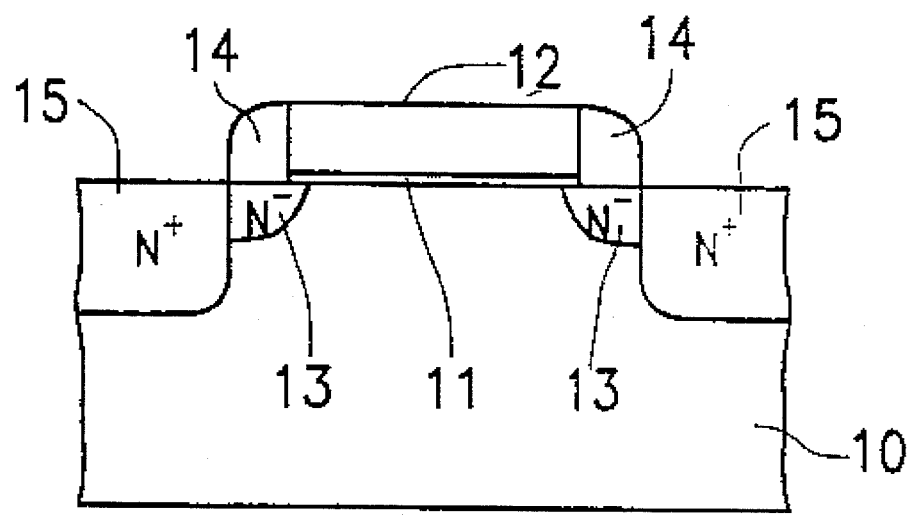
Figure 2A:
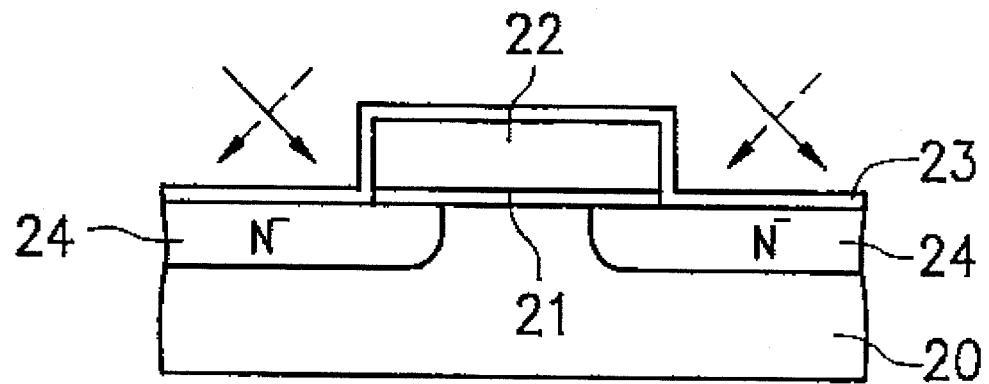
FIGS. 2A to 2B illustrate, in cross-sectional view, the process steps of fabricating a prior art LATID transistor.
Figure 2B:
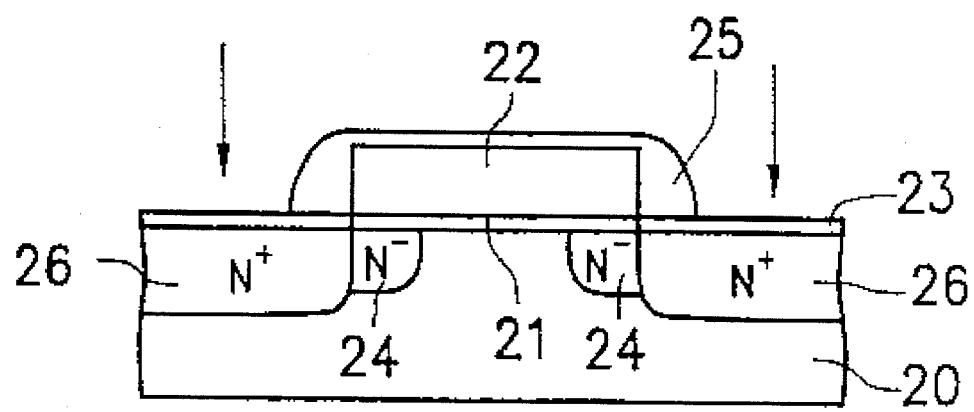
Figure 3A:
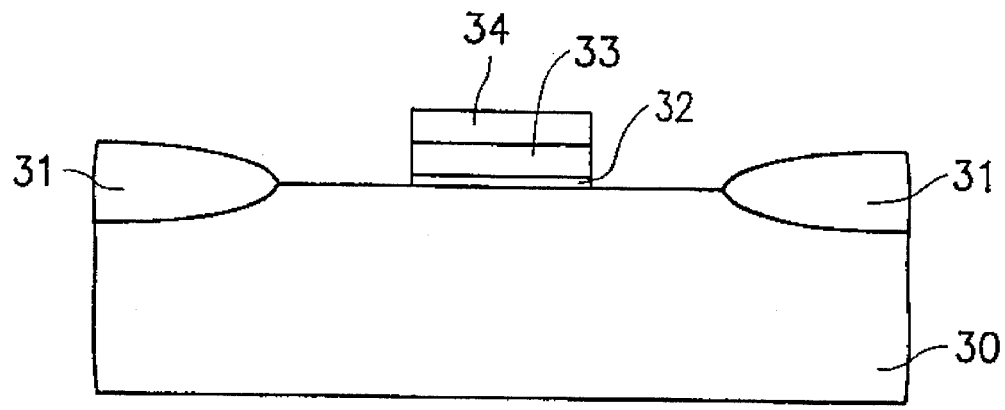
FIGS. 3A to 3F illustrate, in cross-sectional view, the process steps of fabricating a MOS transistor in accordance with the first embodiment of the present invention.
Figure 3B:
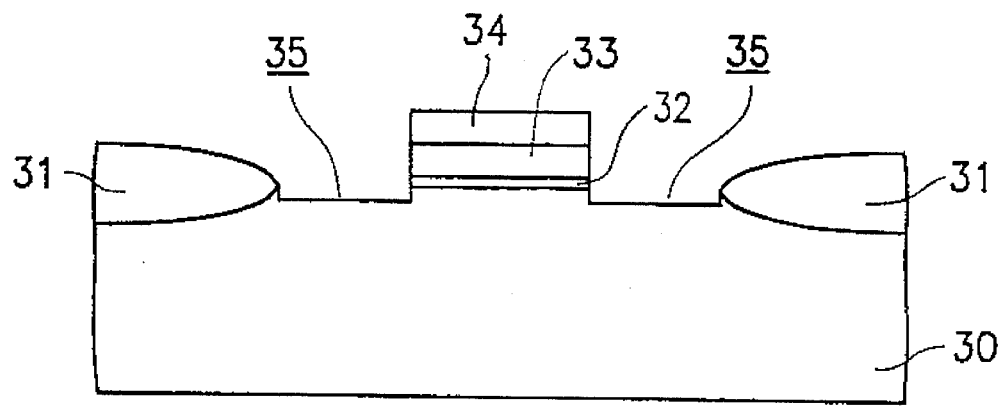

First, as can be seen in FIG. 3A, a field oxide layer 31 is formed on a semiconductor substrate 30, such as a P-type silicon substrate (100). A gate oxide layer 32 and a polysilicon gate layer 33 are formed on the silicon substrate 30 sequentially. The gate oxide layer 32 and the polysilicon gate layer 33 are patterned by using a photoresist layer 34 as a mask to construct a gate electrode. Further, utilizing the photoresist layer 34 as a mask, portions of the silicon substrate 30 adjacent to the gate electrode are etched to form apart a pair of trenches 35 with a depth of between 200Å to 500Å. The result structure is shown in FIG. 3B.

Figure 3C:
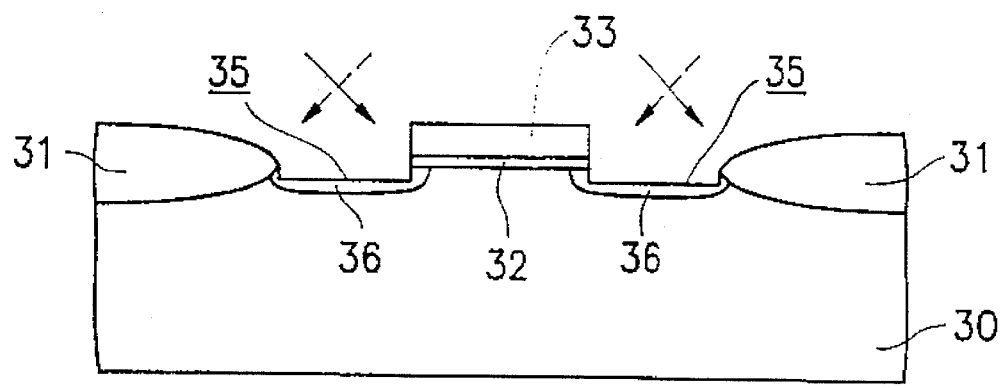

Next, please refer to FIG. 3C. The photoresist layer 34 is removed by an appropriate solvent. N-type impurities, such as phosphorous ions, are now implanted with an angle of about 45 degrees into the silicon substrate 30 using the gate electrode as a mask, so as to form a pair of lightly doped N$^{--}$ source/drain regions 36 in areas around the bottoms and the sidewalls of the trenches 35. For example, the implantation is done with an energy of about 50 KeV and a dosage of between $1 \times 10^{12}$ to $8 \times 10^{12}$ atoms/cm$^2$.

Figure 3D:
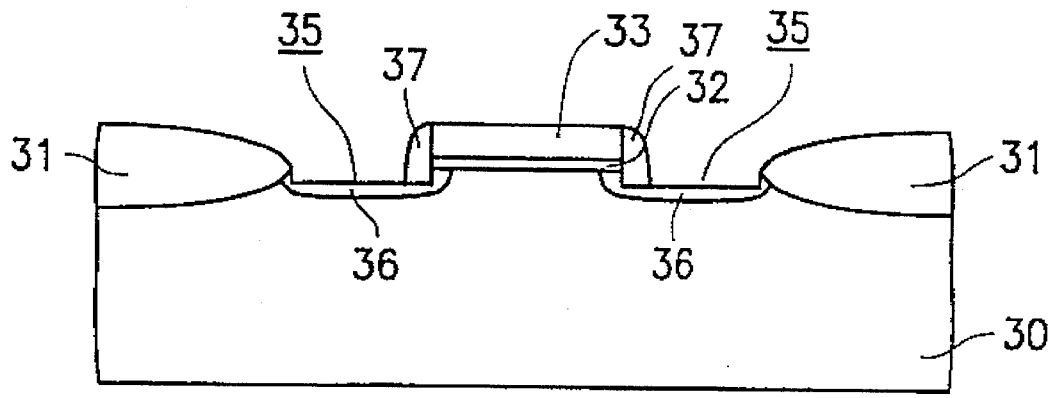
Figure 3E:
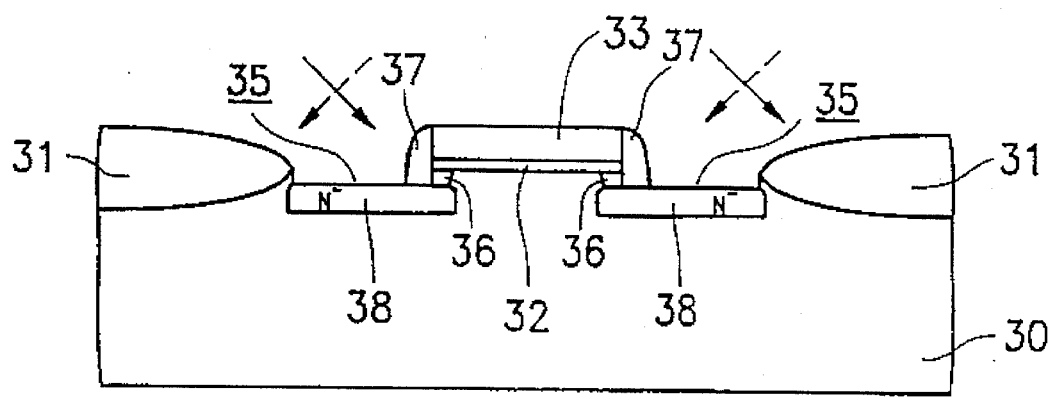

Please now refer to FIG. 3D. A pair of sidewall spacers 37 with a thickness of between 800Å to 1500Å is formed on the sidewalls of the gate electrode and the trenches 35 by using conventional deposition and etching back processes. Then, as the process recited in FIG. 3C, phosphorous ions are implanted with an angle of about 45 degrees into the silicon substrate 30 using the gate electrode and the sidewall spacers 37 as a mask, so as to form a pair of lightly doped N$^-$ source/drain regions 38, as is shown in FIG. 3E. For example, the implantation is done with an energy of about 50 KeV and a dosage of between $1 \times 10^{13}$ to $8 \times 10^{13}$ atoms/cm$^2$.

Figure 3F:
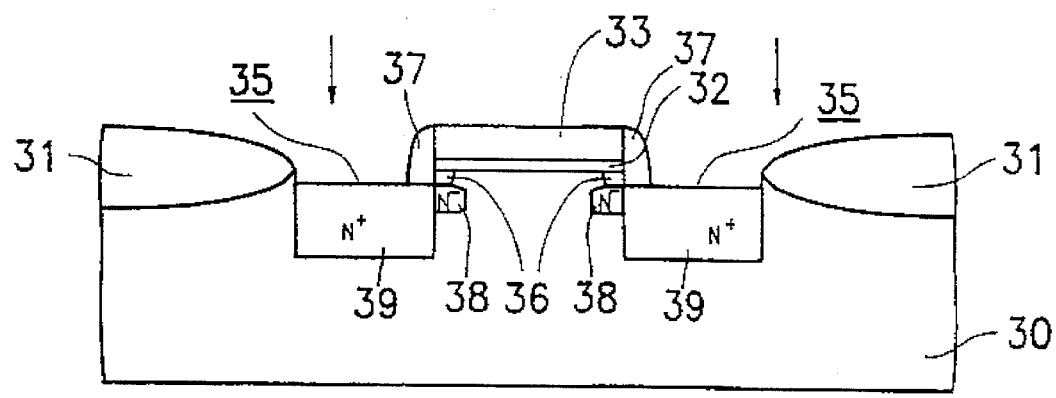

Finally, please refer to FIG. 3F. N-type impurities, such as arsenic ions, are implanted with an angle of about 7 degrees into the silicon substrate 30 to form a pair of heavily doped N$^+$ source/drain regions 39 in areas under the trenches 35. For example, the implantation is done with an energy of about 80 KeV and a dosage of between $1 \times 10^{14}$ to $3 \times 10^{15}$ atoms/cm$^2$. This completes the fabrication of a shallow trench LATID transistor in accordance with the first embodiment of the present invention.

As can be seen in FIG. 3F, lightly doped N$^-$ source/drain regions 38 are located under the gate oxide layer 32 at a depth of between 200Å to 500Å. Hence, the probability of hot electron injection into the gate oxide layer 32 is reduced and the reliability of the transistor is improved. Besides, since the contact area between the N$^{--}$ source/drain regions 36 and the gate oxide layer 32 in this embodiment is smaller than is possible using conventional LATID technique, as well as the N$^-$ source/drain regions 38 are located under the gate oxide layer 32 with a depth of between 200Å to 500Å, the depletion length between the lightly doped regions is relatively increased. This decreases the gate to drain capacitance and improves the device speed.

Embodiment 2

Please now refer to FIGS. 4A to 4E which show the process steps of fabricating a MOS transistor in accordance with the second embodiment of the present invention.

Figure 4A:
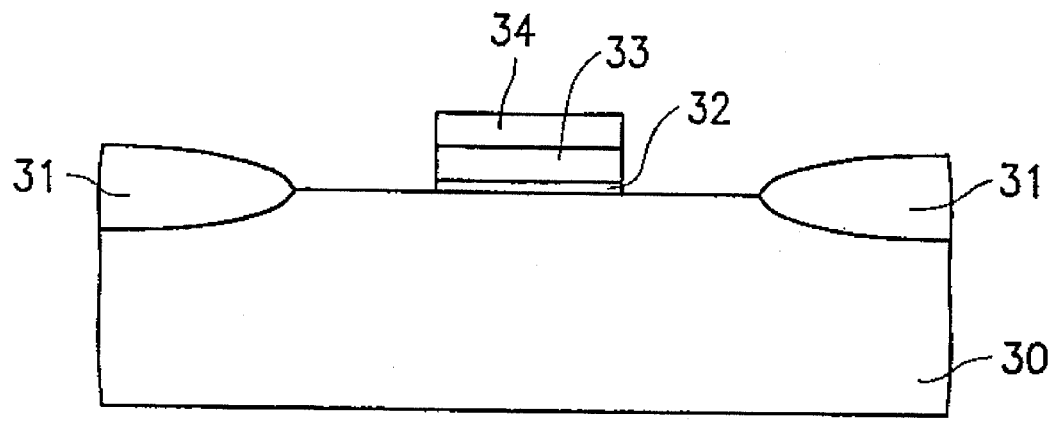
FIGS. 4A to 4E illustrate, in cross-sectional view, the process steps of fabricating a MOS transistor in accordance with the second embodiment of the present invention.
Figure 4B:
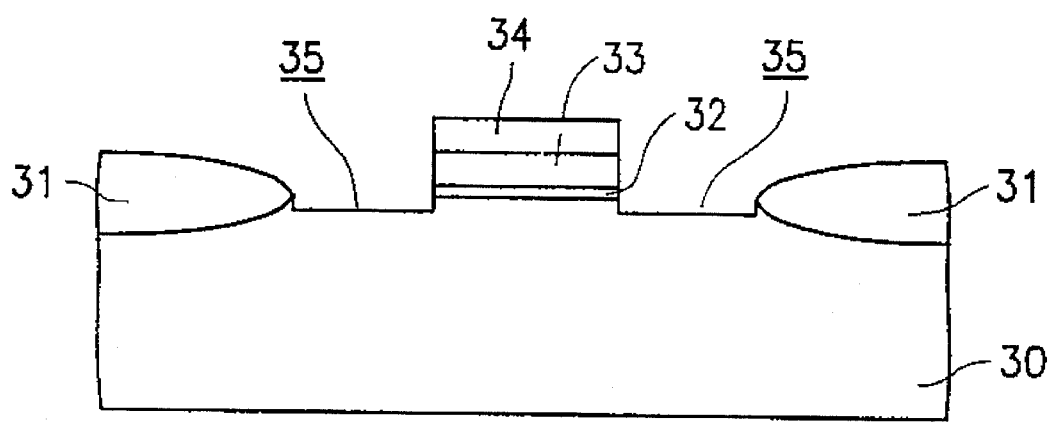
Figure 4C:
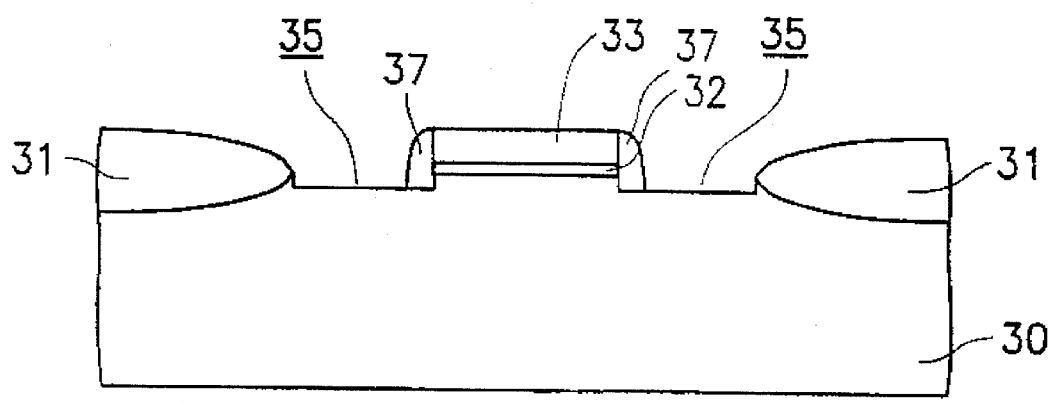

First, please refer to FIG. 4A and FIG. 4B. As recited in FIG. 3A and FIG. 3B, a field oxide layer 31, a gate oxide layer 32, and a polysilicon gate layer 33 are formed on the silicon substrate 30 sequentially. Next, a photoresist layer 34 is formed to act as a mask. A pair of trenches 35 with a depth of between 200Å to 500Å are then formed apart by etching.

The resultant structure is shown in FIG. 4B, which is the same as that in FIG. 3B.

Figure 4D:
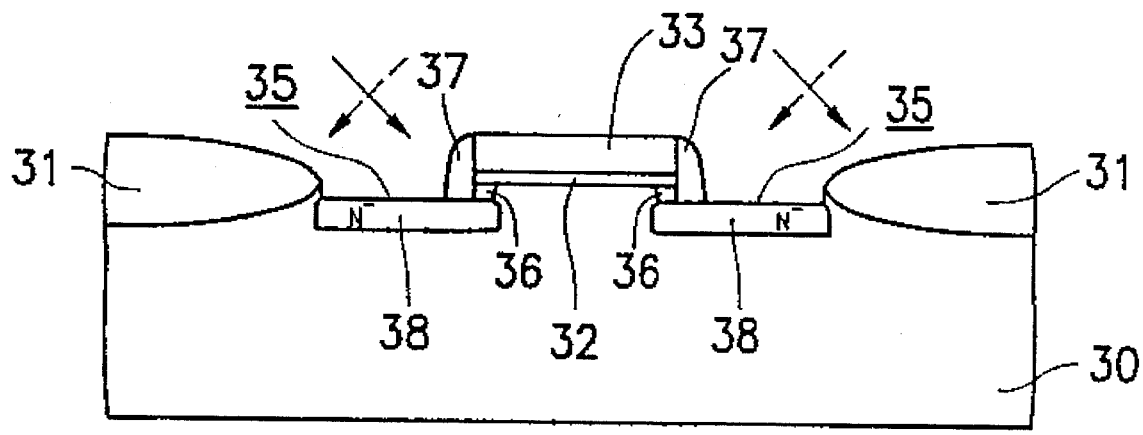

Next, please refer to FIG. 3C. The photoresist layer 34 is removed by an appropriate solvent. A pair of sidewall spacers 37 with a thickness of between 500Å to 800Å is formed on the sidewalls of the gate electrode and the trenches 35 by using conventional deposition and etching back processes. Then, N-type impurities, such as phosphorous ions, are implanted at about 45 degrees angle into the silicon substrate 30 using the gate electrode and the sidewall spacers 37 as a mask, in order to form a pair of lightly doped N$^{--}$ source/drain regions 36 and a pair of lightly doped N$^-$ source/drain regions 38, as is shown in FIG. 4D. For example, the implantation is done with an energy of about 50 KeV and a dosage of between $5 \times 10^{13}$ to $8 \times 10^{13}$ atoms/cm$^2$. Since the sidewall spacers 37 in this embodiment are smaller than those of the first embodiment, a portion of the impurities will be implanted through the sidewall spacers 37 into the silicon substrate 30, so as to form the N$^{--}$ source/drain regions 36 which are located under the gate oxide layer 32 and connected to the sidewall spacers 37. Hence, compared to the first embodiment, one process step is saved in this embodiment.

Figure 4E:
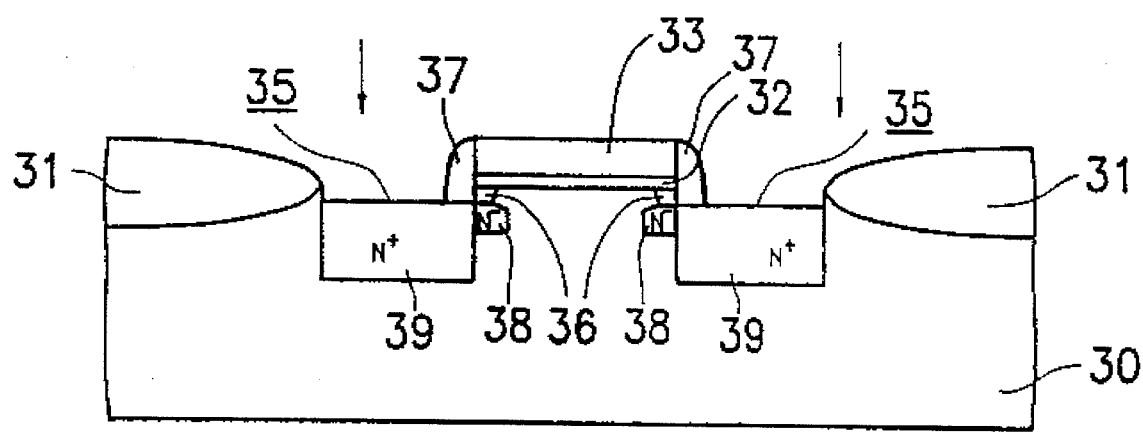

Finally, using the same process recited in FIG. 3F, arsenic ions are implanted at about 7 degrees angle of into the silicon substrate 30 to form a pair of heavily doped N$^+$ source/drain regions 39 in areas under the trenches 35, as is shown in FIG. 4E. This completes the fabrication of a shallow trench LATID transistor in accordance with the second embodiment of the present invention.

Persons skilled in the art will appreciate that the above employed embodiments are intended to describe the spirit and property of the present invention only, not to limit the scope of the present invention. In fact, according to the sprit and property of the present invention, certain conditions such as the conductivity type of the silicon substrate and the implanting materials utilized in the present invention may be changed or modified in order to meet the needs of different applications. That is, the process steps of the present invention also can be utilized to form a transistor on an N-type silicon substrate with P-type impurities implanted. Therefore, the scope of the present invention is defined by the claims below.

What is claimed is:

1. A method of fabricating a MOS transistor on a silicon substrate of a first conductivity type, comprising the steps of:

(a) forming a gate electrode comprising a gate oxide layer and a polysilicon gate layer on said silicon substrate;

(b) forming apart a pair of trenches on portions of said silicon substrate adjacent to said gate electrode;

(c) implanting a first dose of impurities of a second conductivity type into said silicon substrate by using said gate electrode as a mask, so as to form a pair of first source/drain regions in areas around the bottoms and sidewalls of said pair of trenches;

(d) forming a pair of sidewall spacers on the sidewalls of said gate electrode;

(e) implanting a second dose of impurities of the second conductivity type into said silicon substrate by using said gate electrode and said pair of sidewall spacers as a mask, so as to form a pair of second source/drain regions in areas under said pair of first source/drain regions; and (f) implanting a third dose of impurities of the second conductivity type at about 7 degrees angle into said silicon substrate by using said gate electrode and said pair of sidewall spacers as a mask, so as to form a pair of third source/drain regions in areas underneath the bottoms of said pair of trenches.

2. The method of fabricating a MOS transistor according to claim 1, wherein said first conductivity type is P-type and said second conductivity type is N-type.

3. The method of fabricating a MOS transistor according to claim 1, wherein said first conductivity type is N-type and said second conductivity type is P-type.

4. The method of fabricating a MOS transistor according to claim 1, wherein said pair of trenches in step (b) are formed to a depth of between 200Å to 500Å.

5. The method of fabricating a MOS transistor according to claim 4, wherein said impurities of the second conductivity type in step (c) are phosphorous ions with said first dose of between $1\times10^{12}$ to $8\times10^{12}$ atoms/cm$^2$.

6. The method of fabricating a MOS transistor according to claim 5, wherein said pair of sidewall spacers in step (d) have a thickness of between 800Å to 1500Å.

7. The method of fabricating a MOS transistor according to claim 6, wherein said impurities of the second conductivity type in step (e) are phosphorous ions with said second concentration of between $1\times10^{13}$ to $8\times10^{13}$ atoms/cm$^2$.

8. The method of fabricating a MOS transistor according to claim 7, wherein said impurities of the second conductivity type in step (f) are arsenic ions with said third dose of between $1\times10^{14}$ to $3\times10^{15}$ atoms/cm$^2$.

9. A method of fabricating a MOS transistor on a silicon substrate of a first conductivity type, comprising the steps of:

(a) forming a gate electrode comprising a gate oxide layer and a polysilicon gate layer on said silicon substrate;

(b) forming apart a pair of trenches on portions of said silicon substrate adjacent to said gate electrode;

(c) forming a pair of sidewall spacers on the sidewalls of said gate electrode;

(d) implanting a dose of impurities of a second conductivity type with an angle of about 45 degrees into said silicon substrate by using said gate electrode and said pair of sidewall spacers as a mask, so as to form a pair of first source/drain regions and a pair of second source/drain regions simultaneously, wherein said pair of first source/drain regions being deposed apart under said gate electrode and connected to said pair of sidewall spacers, and said pair of second source/drain regions being deposed apart under said pair of first source/drain regions; and (e) implanting impurities of the second conductivity type at about 7 degrees angle into said silicon substrate by using said gate electrode and said pair of sidewall spacers as a mask, so as to form a pair of third source/drain regions in areas underneath the bottoms of said pair of trenches.

10. The method of fabricating a MOS transistor according to claim 9, wherein said first conductivity type is P-type and said second conductivity type is N-type.

11. The method of fabricating a MOS transistor according to claim 9, wherein said first conductivity type is N-type and said second conductivity type is P-type.

12. The method of fabricating a MOS transistor according to claim 9, wherein said pair of trenches in step (b) are formed to a depth of between 200Å to 500Å.

13. The method of fabricating a MOS transistor according to claim 12, wherein said pair of sidewall spacers in step (c) have a thickness of between 500Å to 800Å.

14. The method of fabricating a MOS transistor according to claim 13, wherein said impurities of the second conductivity type in step (d) are phosphorous ions with the dose of between $5\times10^{13}$ to $8\times10^{13}$ atoms/cm$^2$.

15. The method of fabricating a MOS transistor according to claim 14, wherein said impurities of the second conductivity type in step (e) are arsenic ions.

\* \* \* \* \*